(12) United States Patent
Uzoh et al.

(10) Patent No.: US 12,550,799 B2
(45) Date of Patent: Feb. 10, 2026

(54) DIRECT BONDING METHODS AND STRUCTURES

(71) Applicant: ADEIA SEMICONDUCTOR BONDING TECHNOLOGIES INC., San Jose, CA (US)

(72) Inventors: Cyprian Emeka Uzoh, San Jose, CA (US); Thomas Workman, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 346 days.

(21) Appl. No.: 17/657,332

(22) Filed: Mar. 30, 2022

(65) Prior Publication Data

US 2022/0320035 A1 Oct. 6, 2022

Related U.S. Application Data

(60) Provisional application No. 63/168,988, filed on Mar. 31, 2021.

(51) Int. Cl.
*H01L 21/00* (2006.01)
*H01L 23/00* (2006.01)

(52) U.S. Cl.
CPC .............. *H01L 24/80* (2013.01); *H01L 24/03* (2013.01); *H01L 24/05* (2013.01); *H01L 24/08* (2013.01);
(Continued)

(58) Field of Classification Search
CPC ......... H01L 24/80; H01L 24/03; H01L 24/05; H01L 24/08; H01L 24/94; H01L 2224/03009; H01L 2224/038; H01L 2224/05571; H01L 2224/05572; H01L 2224/05647; H01L 2224/058145; H01L 2224/80004; H01L 2224/80009; H01L 2224/80031; H01L 2224/80379;
(Continued)

(56) References Cited

U.S. PATENT DOCUMENTS 5,051,802 A 9/1991 Prost et al.
5,753,536 A 5/1998 Sugiyama et al.
(Continued)

FOREIGN PATENT DOCUMENTS

CN 2038954 U 10/2014
CN 104246971 A 12/2014
(Continued)

OTHER PUBLICATIONS

International Search Report and Written Opinion, dated Jul. 25, 2022, for International Application No. PCT/US2022/022677, 15 pages.
(Continued)

*Primary Examiner* — Niki H Nguyen
(74) *Attorney, Agent, or Firm* — Knobbe, Martens, Olson & Bear, LLP

(57) ABSTRACT

Disclosed herein are methods for direct bonding. In some embodiments, a direct bonding method comprises preparing a first bonding surface of a first element for direct bonding to a second bonding surface of a second element; and after the preparing, providing a protective layer over the prepared first bonding surface of the first element, the protective layer having a thickness less than 3 microns.

19 Claims, 7 Drawing Sheets

(52) U.S. Cl.
CPC .... *H01L 24/94* (2013.01); *H01L 2224/03009* (2013.01); *H01L 2224/038* (2013.01); *H01L 2224/05571* (2013.01); *H01L 2224/05572* (2013.01); *H01L 2224/05647* (2013.01); *H01L 2224/08145* (2013.01); *H01L 2224/80004* (2013.01); *H01L 2224/80009* (2013.01); *H01L 2224/80031* (2013.01); *H01L 2224/80379* (2013.01); *H01L 2224/80895* (2013.01); *H01L 2224/80896* (2013.01); *H01L 2224/80905* (2013.01); *H01L 2224/94* (2013.01); *H01L 2924/095* (2013.01)

(58) Field of Classification Search
CPC . H01L 2224/80895; H01L 2224/80896; H01L 2224/80905; H01L 2224/94; H01L 2924/095; H01L 25/0657; H01L 24/16; H01L 24/81; H01L 2224/73204; H01L 24/13; H01L 2224/04105; H01L 24/73; H01L 2224/0401; H01L 23/5389; H01L 25/0753; H01L 2224/32145; H01L 2224/12105; H01L 2224/08145; H01L 2224/16227; H01L 2221/68327; H01L 2225/06513; H01L 2224/16145; H01L 23/5386; H01L 2225/06517; H01L 2224/16235; H01L 2224/73253; H01L 23/49822; H01L 21/4857; H01L 2224/06181; H01L 21/76877; H01L 23/5226; H01L 24/14; H01L 2224/81191; H01L 24/82; H01L 2224/80001; H01L 2224/13025; H01L 2224/73259; H01L 2224/81801; H01L 27/14687; H01L 27/14632; H01L 2224/04042; H01L 2224/1703; H01L 2224/33181; H01L 24/02; H01L 21/76251; H01L 2224/09517; H01L 2224/05009; H01L 2224/14181; H01L 2224/08235; H01L 2224/83801; H01L 2224/84801; H01L 2224/73203; H01L 2224/73257
See application file for complete search history.

(56) References Cited

U.S. PATENT DOCUMENTS

| | | | |
|---|---|---|---|
| 5,771,555 A | 6/1998 | Eda et al. | |
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 6,984,571 B1 | 1/2006 | Enquist | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,550,366 B2 | 6/2009 | Suga et al. | |
| 7,582,971 B2 | 9/2009 | Kameyama et al. | |
| 7,663,231 B2 | 2/2010 | Chang et al. | |
| 7,686,912 B2 | 3/2010 | Suga et al. | |
| 7,750,488 B2 | 7/2010 | Patti et al. | |
| 7,759,751 B2 | 7/2010 | Ono | |
| 7,803,693 B2 | 9/2010 | Trezza | |
| 7,906,410 B2 | 3/2011 | Arita et al. | |
| 8,168,458 B2 | 5/2012 | Do et al. | |
| 8,183,127 B2 | 5/2012 | Patti et al. | |
| 8,193,632 B2 | 6/2012 | Chang et al. | |
| 8,263,434 B2 | 9/2012 | Pagaila et al. | |
| 8,268,699 B2 | 9/2012 | Park et al. | |
| 8,318,586 B2 | 11/2012 | Libralesso et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,505,197 B2 | 8/2013 | Blanchard | |
| 8,524,533 B2 | 9/2013 | Tong et al. | |
| 8,618,659 B2 | 12/2013 | Sato et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,791,575 B2 | 7/2014 | Oganesian et al. | |
| 8,802,538 B1 | 8/2014 | Liu | |
| 8,809,123 B2 * | 8/2014 | Liu | H01L 24/05 438/455 |
| 8,841,002 B2 | 9/2014 | Tong | |
| 8,866,305 B2 | 10/2014 | Sadaka et al. | |
| 8,878,353 B2 | 11/2014 | Haba et al. | |
| 9,018,079 B1 | 4/2015 | Lei et al. | |
| 9,076,860 B1 | 7/2015 | Lei et al. | |
| 9,093,350 B2 | 7/2015 | Endo et al. | |
| 9,136,293 B2 | 9/2015 | Yee et al. | |
| 9,142,459 B1 | 9/2015 | Kumar et al. | |
| 9,142,517 B2 | 9/2015 | Liu et al. | |
| 9,142,532 B2 | 9/2015 | Suga et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,252,172 B2 | 2/2016 | Chow et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,476,898 B2 | 10/2016 | Takano | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,666,573 B1 | 5/2017 | Sukekawa et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,870,922 B2 | 1/2018 | Suga et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,971,777 B2 | 5/2018 | Bertin et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,269,853 B2 | 4/2019 | Katkar et al. | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,434,749 B2 | 10/2019 | Tong | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,515,925 B2 | 12/2019 | Uzoh | |
| 10,522,499 B2 | 12/2019 | Enquist et al. | |
| 10,566,219 B2 | 2/2020 | Kurita et al. | |
| 10,707,087 B2 | 7/2020 | Uzoh et al. | |

(56) References Cited

U.S. PATENT DOCUMENTS

| | | |
|---|---|---|
| 10,714,449 B2 | 7/2020 | Uzoh |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,664,357 B2 | 5/2023 | Fountain, Jr. et al. |
| 11,710,718 B2 | 7/2023 | Uzoh |
| 11,742,314 B2 | 8/2023 | Uzoh et al. |
| 11,742,315 B2 | 8/2023 | Uzoh |
| 11,855,064 B2 | 12/2023 | Uzoh et al. |
| 2002/0003307 A1 | 1/2002 | Suga |
| 2002/0048906 A1 | 4/2002 | Sakai et al. |
| 2002/0053730 A1 | 5/2002 | Mashino |
| 2004/0084414 A1 | 5/2004 | Sakai et al. |
| 2004/0235266 A1 | 11/2004 | Tong |
| 2005/0009246 A1 | 1/2005 | Enquist et al. |
| 2005/0031795 A1 | 2/2005 | Chaudhury et al. |
| 2006/0057945 A1 | 3/2006 | Hsu et al. |
| 2006/0087042 A1 | 4/2006 | Kameyama et al. |
| 2006/0234473 A1* | 10/2006 | Wong .................. H01L 23/3157 |
| | | 438/455 |
| 2007/0075417 A1 | 4/2007 | Hwang et al. |
| 2007/0111386 A1 | 5/2007 | Kim et al. |
| 2007/0111476 A1 | 5/2007 | Sugiura et al. |
| 2007/0224733 A1 | 9/2007 | Boyle et al. |
| 2008/0245408 A1 | 10/2008 | Ito et al. |
| 2008/0308928 A1 | 12/2008 | Chang |
| 2009/0186216 A1 | 7/2009 | Inada et al. |
| 2009/0227089 A1 | 9/2009 | Plaut et al. |
| 2009/0298264 A1 | 12/2009 | Arai et al. |
| 2010/0167534 A1 | 7/2010 | Iwata |
| 2011/0175243 A1 | 7/2011 | Jo et al. |
| 2011/0230005 A1 | 9/2011 | Vaufredaz et al. |
| 2012/0077329 A1 | 3/2012 | Broekaart et al. |
| 2012/0187516 A1 | 7/2012 | Sato |
| 2012/0194719 A1 | 8/2012 | Churchwell et al. |
| 2013/0026643 A1 | 1/2013 | England et al. |
| 2013/0153093 A1 | 6/2013 | Vandroux et al. |
| 2013/0252399 A1 | 9/2013 | Leduc et al. |
| 2013/0270328 A1 | 10/2013 | Di Cioccio et al. |
| 2014/0001949 A1 | 1/2014 | Kimura et al. |
| 2014/0011324 A1* | 1/2014 | Liu ........................ H01L 24/74 |
| | | 438/455 |
| 2014/0175655 A1 | 6/2014 | Chen et al. |
| 2014/0312511 A1 | 10/2014 | Nakamura et al. |
| 2014/0314370 A1 | 10/2014 | Hatori et al. |
| 2015/0031189 A1 | 1/2015 | Chen et al. |
| 2015/0064498 A1 | 3/2015 | Tong |
| 2015/0118825 A1 | 4/2015 | Ishizuka |
| 2015/0243611 A1 | 8/2015 | Liu et al. |
| 2015/0255349 A1 | 9/2015 | Holden et al. |
| 2015/0279816 A1 | 10/2015 | Chen et al. |
| 2015/0287694 A1* | 10/2015 | Liu ........................ H01L 24/05 |
| | | 438/455 |
| 2015/0314385 A1 | 11/2015 | Abe et al. |
| 2016/0126218 A1 | 5/2016 | Kurita |
| 2016/0190103 A1 | 6/2016 | Kabe et al. |
| 2016/0343682 A1 | 11/2016 | Kawasaki |
| 2018/0005977 A1 | 1/2018 | Lin et al. |
| 2018/0012787 A1 | 1/2018 | Oka et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0308819 A1 | 10/2018 | Uzoh |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0043914 A1 | 2/2019 | Von Känel |
| 2019/0051628 A1 | 2/2019 | Liu et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0157333 A1 | 5/2019 | Tsai |
| 2019/0198409 A1 | 6/2019 | Katkar et al. |
| 2019/0199058 A1 | 6/2019 | Pierer et al. |
| 2019/0252364 A1 | 8/2019 | Uzoh et al. |
| 2019/0265411 A1 | 8/2019 | Huang et al. |
| 2019/0287788 A1 | 9/2019 | Lin et al. |
| 2019/0326252 A1* | 10/2019 | Mandalapu ............ H01L 24/03 |
| 2019/0333550 A1 | 10/2019 | Fisch |
| 2019/0344533 A1 | 11/2019 | Tong |
| 2019/0358955 A1 | 11/2019 | Giusti et al. |
| 2019/0371761 A1 | 12/2019 | Uzoh et al. |
| 2019/0385935 A1 | 12/2019 | Gao et al. |
| 2019/0385966 A1 | 12/2019 | Gao et al. |
| 2020/0006266 A1 | 1/2020 | Chen et al. |
| 2020/0013637 A1 | 1/2020 | Haba |
| 2020/0013754 A1 | 1/2020 | Gao et al. |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0299127 A1 | 9/2020 | Brioschi et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0175280 A1 | 6/2021 | Chae et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202567 A1 | 7/2021 | Kim et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |

(56) References Cited

U.S. PATENT DOCUMENTS

| | | |
|---|---|---|
| 2021/0366820 A1 | 11/2021 | Uzoh |
| 2021/0375850 A1 | 12/2021 | Uzoh et al. |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0021572 A1 | 1/2024 | Uzoh |
| 2024/0021573 A1 | 1/2024 | Uzoh et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0371850 A1 | 11/2024 | Uzoh et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |

FOREIGN PATENT DOCUMENTS

| | | |
|---|---|---|
| CN | 106409650 A | 2/2017 |
| CN | 107331759 A | 11/2017 |
| EP | 1011133 A1 | 6/2000 |
| JP | 2002-353416 A | 12/2002 |
| JP | 2008-130603 A | 6/2008 |
| JP | 2008-244080 A | 10/2008 |
| JP | 2009-514185 A | 4/2009 |
| JP | 2011-104633 A | 6/2011 |
| JP | 2013-033786 A | 2/2013 |
| JP | 2015-517217 A | 6/2015 |
| JP | 2016-072316 A | 5/2016 |
| JP | 2018-160519 | 10/2018 |
| TW | 201401573 A | 1/2014 |
| TW | 201423873 A | 6/2014 |
| TW | 201612965 A | 4/2016 |
| WO | WO 00/59006 A1 | 10/2000 |
| WO | WO 2005/043584 A2 | 5/2005 |
| WO | WO 2007/021639 A2 | 2/2007 |
| WO | WO 2008/112101 A2 | 9/2008 |
| WO | WO 2009/158378 A2 | 12/2009 |
| WO | WO 2013/021251 A1 | 2/2013 |
| WO | WO 2012/133760 A1 | 7/2014 |
| WO | WO 2016/003709 A1 | 1/2016 |
| WO | WO 2018/194827 A1 | 10/2018 |

OTHER PUBLICATIONS

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Claims from U.S. Appl. No. 17/452,753, filed Oct. 28, 2021 (Year: 2021)—4 pages.

Claims from U.S. Appl. No. 17/657,332, filed Jun. 7, 2022 (Year : 2022)—4 pages.

Ghernaout, D., "The hydrophilic/hydrophobic ratio vs. dissolved organics removal by coagulation—A review". J King Saud University-Science. Jul. 1, 2014;26(3): 169-180.

Geyer et al., "When and how self-cleaning superhydrophobic surfaces works". Sci Adv Jan. 17, 2020;6:eaaw9727 (11 pages).

Lei, Wei-Sheng et al., "Die singulation technologies for advanced packaging: A critical review," J. Vac. Sci. Technol. B, Jul./Aug. 2012, vol. 30, No. 4, pp. 040801-1-040801-27.

Luo, X. et al., "High-throughput multiple dies-to-wafer bonding technology and III/V-on-Si hybrid lasers for heterogeneous integration of optoelectronic integrated circuits," Frontiers in Materials, Apr. 2015, vol. 2, Article 28, pp. 1-21.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes No. representation that the part in the image is identical to the part identified in the separately submitted reference Bush, Nov. 8, 2018, ElectronicsWeekly.com ("Bush article"); however, the imaged part and the part shown in the Bush article share the part number "Onsemi AR0820."

(56) References Cited

OTHER PUBLICATIONS

Sony IMX260 images, showing various cross sections and materials analyses for a hybrid bonded back side illuminated CMOS image sensor. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
European Partial Search Report dated Jan. 7, 2025, in corresponding EP Application No. 22782147.7, 15 pages.
Inoue, F. et al., "Influence of composition of SiCN as interfacial layer on plasma activated direct bonding," ECS Journal of Solid State Science and Technology, 2019, vol. 8, No. 6, pp. P346-P350.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.
Plobi, A. et al., "Wafer direct bonding: tailoring adhesion between brittle materials," Materials Science and Engineering Review Journal, 1999, R25, 88 pages.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

* cited by examiner

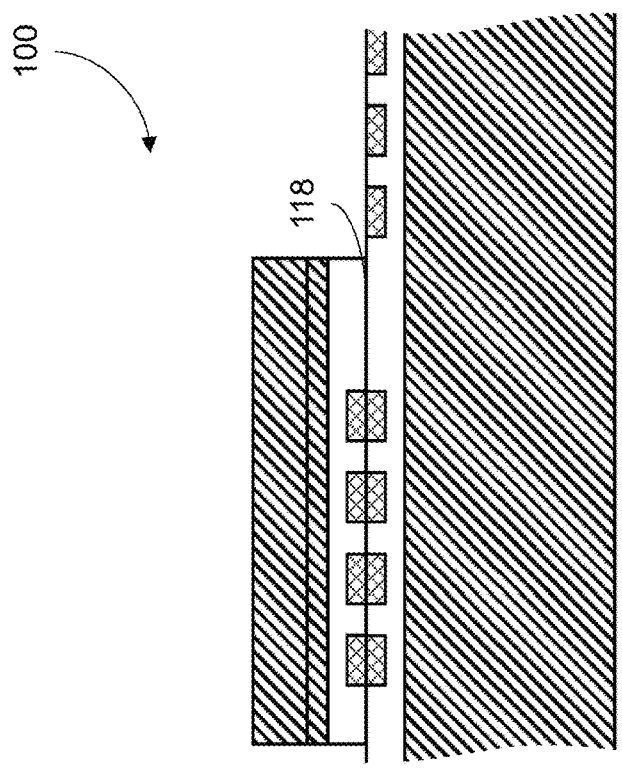
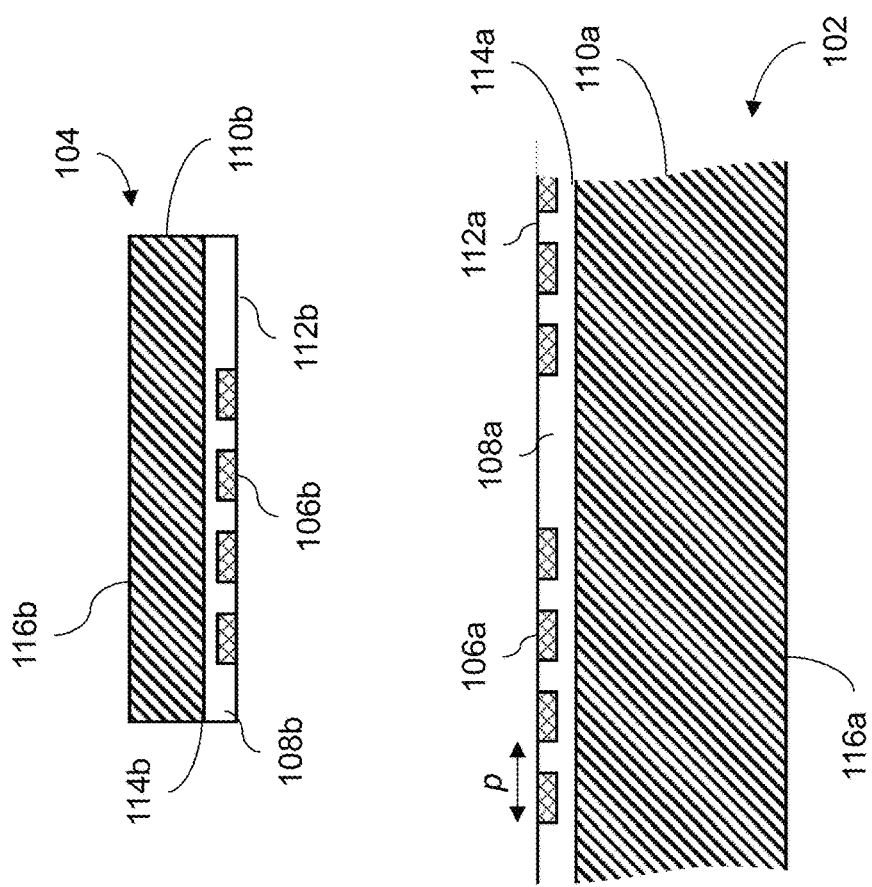
Fig. 1b
Fig. 1a

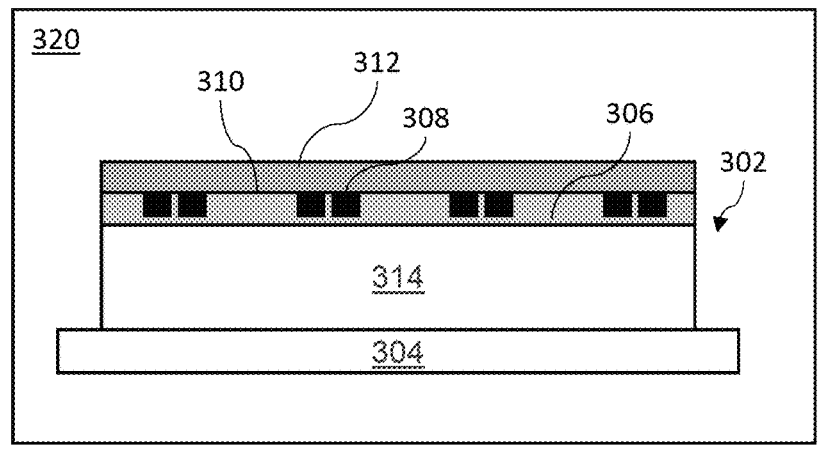
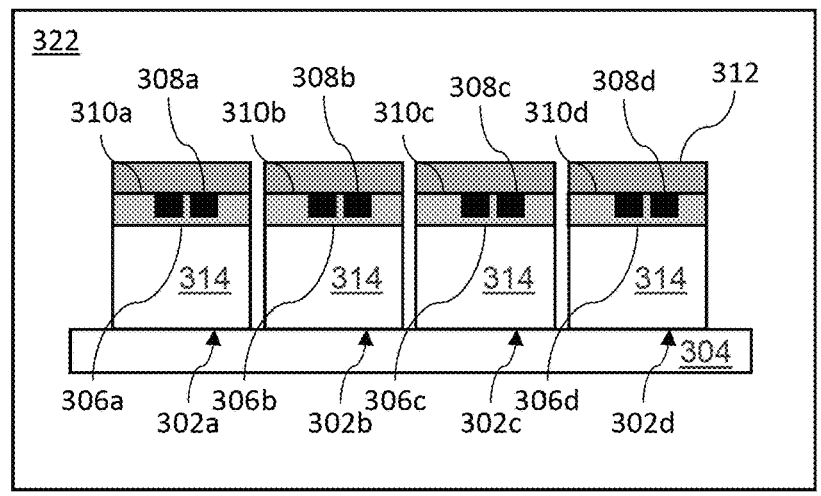
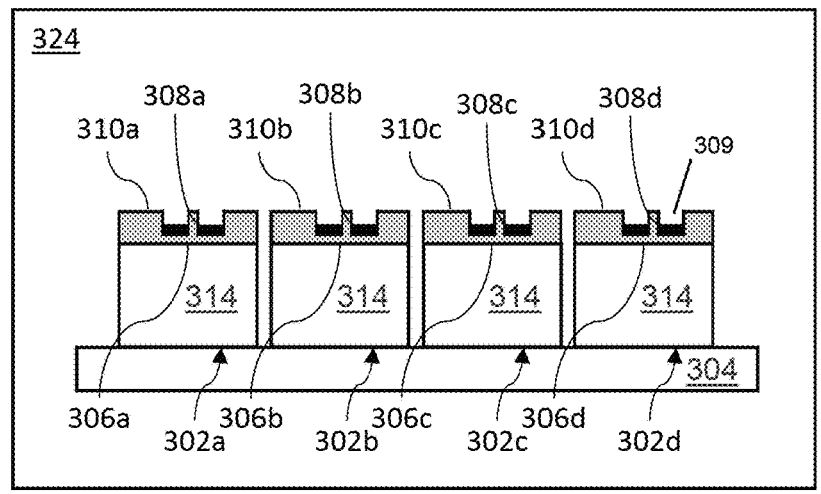
FIG. 3

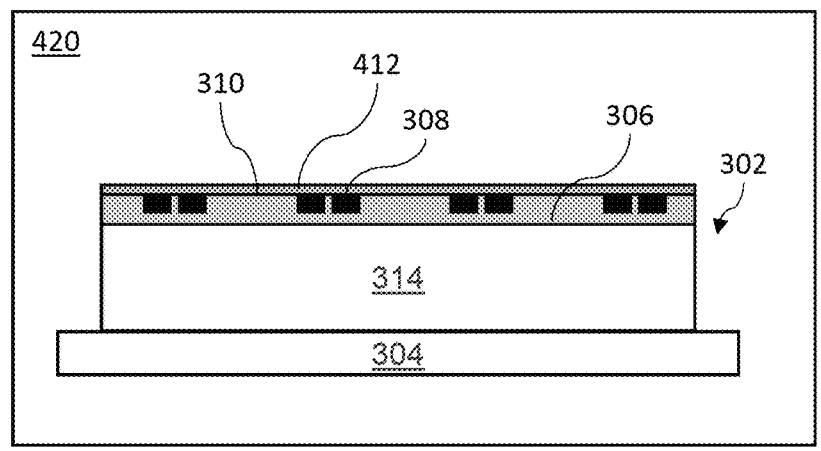
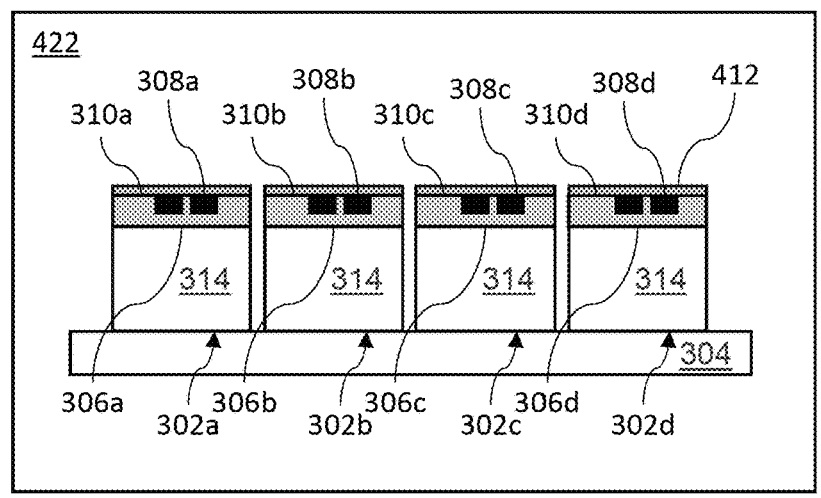
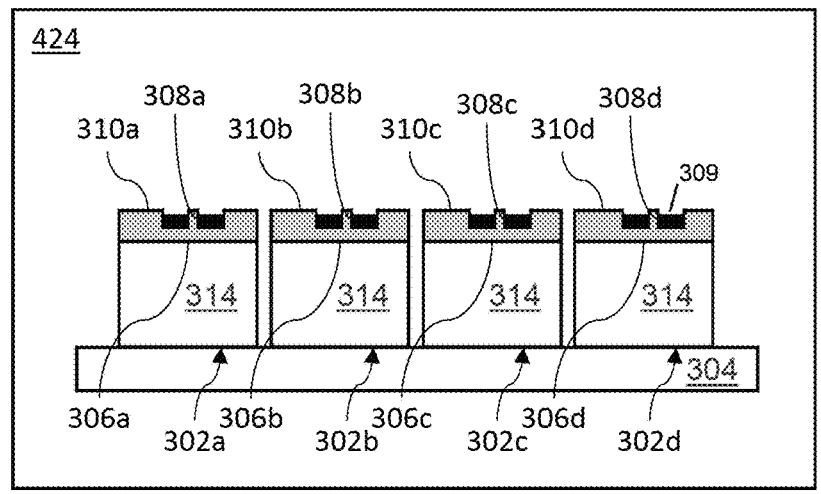
FIG. 4

DIRECT BONDING METHODS AND STRUCTURES

INCORPORATION BY REFERENCE TO ANY PRIORITY APPLICATIONS

Any and all application for which a foreign or domestic priority claim is identified in the Application Data Sheet as filed with the present application are hereby incorporated by reference under 37 CFR 1.57.

This application claims the benefit under 35 U.S.C. § 119(e) to U.S. Provisional Application No. 63/168,988, entitled "DIRECT BONDING METHODS AND STRUCTURES," filed on Mar. 31, 2021, the entirety of which is hereby incorporated by reference herein.

BACKGROUND

Field

The field relates to direct bonding methods and structures.

Description of the Related Art

Semiconductor elements, such as semiconductor wafers or integrated device dies, can be stacked and directly bonded to one another without an adhesive. For example, in some hybrid direct bonded structures, non-conductive field regions of the elements can be directly bonded to one another, and corresponding conductive contact structures can be directly bonded to one another. In some applications, it can be challenging to protect the contact pads before bonding. Accordingly, there remains a continuing need for improved contact structures for direct bonding.

SUMMARY

In one embodiment, a bonding method can include: preparing a first bonding surface of a first element for direct bonding to a second bonding surface of a second element; and after the preparing, providing a protective layer over the prepared first bonding surface of the first element, the protective layer having a thickness less than 3 microns.

In some embodiments, preparing the first bonding surface comprises activating the first bonding surface. In some embodiments, activating the first bonding surface comprises plasma activating the first bonding surface. In some embodiments, plasma activating the first bonding surface comprises exposing the first bonding surface to a nitrogen-containing plasma. In some embodiments, the thickness of the protective layer is less than 2 microns. In some embodiments, the thickness of the protective layer is less than 0.25 microns. In some embodiments, the thickness of the protective layer is in a range of 0.05 microns to 2 microns. In some embodiments, the thickness of the protective layer is in a range of 0.1 microns to 0.25 microns. In some embodiments, the protective layer comprises an organic layer. In some embodiments, the protective layer comprises a hydrophobic coating and/or a hydrophilic coating. In some embodiments, the protective layer comprises a photoresist. In some embodiments, providing the protective layer comprises blanket depositing the protective layer over the first bonding surface. In some embodiments, the bonding method includes removing the blanket deposited protective layer using a reactive ion etching (RIE) process. In some embodiments, the bonding method includes, before the removing, cleaning particles from the first element. In some embodiments, the bonding method includes, before providing the protective layer, selectively providing a passivation layer over a plurality of contact pads, and wherein providing the protective layer comprises providing the protective layer over the passivation layer. In some embodiments, providing the protective layer comprises selectively providing the protective layer over conductive contact pads of the first bonding surface. In some embodiments, the first bonding surface includes a plurality of contact pads, the contact pads protruding above a first non-conductive region of the first bonding surface, wherein providing the protective layer comprises providing the protective layer over at least the protruding contact pads. In some embodiments, providing the protective layer comprises blanket depositing the protective layer over the first bonding surface. In some embodiments, the bonding method includes planarizing the first element such that the plurality of contact pads are flush with or recessed below the first non-conductive region. In some embodiments, the first bonding surface includes a first plurality of conductive contact pads and a first non-conductive bonding region, the first plurality of conductive contact pads recessed below the first non-conductive bonding region. In some embodiments, the first plurality of conductive contact pads are recessed below the first non-conductive bonding region by no more than 10 nm. In some embodiments, a variation in recess depth of the first plurality of contact pads across the first element is less than 25%. In some embodiments, the variation in recess depth of the first plurality of contact pads across the first element is less than 10%. In some embodiments, the variation in recess depth of the first plurality of contact pads across the first element is less than 5%. In some embodiments, the bonding method includes comprising removing the protective layer. In some embodiments, the first element comprises a wafer, the method further comprising, before removing the protective layer, singulating the wafer to form a plurality of singulated elements. In some embodiments, the bonding method includes, after removing the protective layer, directly bonding the first bonding surface of the first element to the second bonding surface of the second element without an intervening adhesive. In some embodiments, the first bonding surface comprises a first plurality of conductive contact pads and a first non-conductive bonding region, wherein the second bonding surface comprises a second plurality of conductive contact pads and a second non-conductive bonding region, and wherein directly bonding comprise hybrid direct bonding, including directly bonding the first and second pluralities of conductive contact pads to one another without an adhesive and directly bonding the first and second non-conductive bonding regions to one another without an adhesive. In some embodiments, the first non-conductive bonding region comprises a silicon-containing dielectric layer. In some embodiments, the bonding method includes activating the second bonding surface before directly bonding. In some embodiments, preparing the first bonding surface and providing the protective layer are performed in a first facility, and wherein directly bonding is performed at a second facility that is in a different location from the first facility. In some embodiments, directly bonding is performed more than twenty-four (24) hours after activating the first bonding layer.

In another embodiment, a bonding method includes: preparing a first bonding surface of a first element for direct bonding to a second bonding surface of a second element; after the preparing, selectively providing a passivation layer over a plurality of contact pads of the first bonding surface;

and after providing the passivation layer, providing the protective layer over the passivation layer.

In some embodiments, providing the protective layer comprises blanket depositing the protective layer over the first bonding surface. In some embodiments, the protective layer has a thickness less than 3 microns. In some embodiments, the thickness of the protective layer is less than 2 microns. In some embodiments, the thickness of the protective layer is less than 0.25 microns. In some embodiments, the thickness of the protective layer is in a range of 0.05 microns to 2 microns. In some embodiments, the thickness of the protective layer is in a range of 0.1 microns to 0.25 microns. In some embodiments, the protective layer comprises an organic layer. In some embodiments, the protective layer comprises a hydrophobic coating and/or a hydrophilic coating. In some embodiments, the method can include removing the protective layer. In some embodiments, the first element comprises a wafer, the method further comprising, before removing the protective layer, singulating the wafer to form a plurality of singulated elements. In some embodiments, the method can include, after removing the protective layer, directly bonding the first bonding surface of the first element to the second bonding surface of the second element without an intervening adhesive. In some embodiments, the first plurality of conductive contact pads are recessed below a first non-conductive bonding region of the first bonding surface. In some embodiments, the first plurality of conductive contact pads are recessed below the first non-conductive bonding region by no more than 10 nm. In some embodiments, a variation in recess depth of the first plurality of contact pads is less than 25%. In some embodiments, the variation in recess depth of the first plurality of contact pads is less than 10%, for example, less than 5%.

In another embodiment, a bonding method can include: preparing a first bonding surface of a first element for direct bonding to a second bonding surface of a second element; and after the preparing, selectively providing a protective layer over a plurality of contact pads of the first bonding surface.

In some embodiments, the first bonding surface further includes a first non-conductive material, wherein no protective layer is provided over an entirety of the first non-conductive material. In some embodiments, the protective layer has a thickness less than 3 microns. In some embodiments, the thickness of the protective layer is less than 2 microns. In some embodiments, the thickness of the protective layer is less than 0.25 microns. In some embodiments, the thickness of the protective layer is in a range of 0.05 microns to 2 microns. In some embodiments, the thickness of the protective layer is in a range of 0.1 microns to 0.25 microns. In some embodiments, the protective layer comprises an organic layer. In some embodiments, the protective layer comprises a hydrophobic coating and/or a hydrophilic coating. In some embodiments, the method can include providing a passivation layer comprising oxidizing surfaces of the contact pads. In some embodiments, the method can include removing the protective layer. In some embodiments, the first element comprises a wafer, the method further comprising, before removing the protective layer, singulating the wafer to form a plurality of singulated elements. In some embodiments, the method can include, after removing the protective layer, directly bonding the first bonding surface of the first element to the second bonding surface of the second element without an intervening adhesive.

In another embodiment, a bonding method can include: preparing a first bonding surface of a first element for direct bonding to a second bonding surface of a second element, the first bonding surface including a first non-conductive region and a first plurality of contact pads protruding above the first non-conductive region; and after the preparing, providing a protective layer over at least the first plurality of contact pads.

In some embodiments, providing the protective layer comprises blanket depositing the protective layer over the first bonding surface. In some embodiments, the method can include planarizing the first element such that the first plurality of contact pads are recessed below the first non-conductive region. In some embodiments, the method can include removing the protective material.

In another embodiment, a bonding method can include: preparing a first bonding surface of a first element for direct bonding to a second bonding surface of a second element; and after the preparing, selectively providing a passivation layer over a plurality of contact pads of the first bonding surface.

In some embodiments, providing the passivation layer comprising oxidizing surfaces of the contact pads. In some embodiments, the method can include singulating the first element with the passivation layer over the plurality of contact pads, wherein the passivation layer is exposed at an upper surface of the element during the singulating.

In some embodiments, a semiconductor element comprises: a device region; a bonding layer over the device region, the bonding layer having a bonding surface prepared for direct hybrid bonding to a second element; and a protective layer over at least a portion of the prepared first bonding surface, the protective layer having a thickness less than 3 microns. In some embodiments, the protective layer comprises a photoresist. In some embodiments, the semiconductor element is in wafer form. In some embodiments, the thickness of the protective layer is in a range of 0.05 microns to 2 microns. In some embodiments, the bonding layer comprises a plurality of conductive contact pads and a non-conductive bonding region. In some embodiments, the semiconductor element further comprises a passivation layer over the plurality of conductive contact pads between the plurality of contact pads and the protective layer. In some embodiments, the protective layer is selectively provided over the plurality of conductive contact pads. In some embodiments, the plurality of conductive contact pads protrudes above the bonding layer. In some embodiments, the plurality of conductive contact pads is recessed below an upper surface of the bonding layer. In some embodiments, the protective layer is blanket deposited over the bonding surface.

In some embodiments, a semiconductor element comprises: a device region; a bonding layer over the device region, the bonding layer having a bonding surface prepared for direct hybrid bonding to a second element and including a plurality of conductive contact pads and a non-conductive bonding region, the plurality of conductive contact pads each having a recess depth by which the conductive contact pads are recessed below the bonding surface, wherein a variation in recess depth of the plurality of contact pads is less than 25%. In some embodiments, the variation in recess depth of the plurality of conductive contact pads is less than 10%. In some embodiments, the variation in recess depth of the plurality of conductive contact pads is in a range of 0.5% to 10%, or in a range of 0.1% to 5%.

In some embodiments, a semiconductor element comprises: a device region; a bonding layer over the device region, the bonding layer having a bonding surface prepared for direct hybrid bonding; and a conductive layer exposed at a portion of the prepared bonding surface, the conductive layer having a recess variation less than 5 nm within the bonding surface of the device. In some embodiments, the recess variation is less than 3 nm within the bonding surface of the device. In some embodiments, the recess variation is less than 2 nm within the bonding surface of the device. In some embodiments, the recess variation is less than 1 nm within the bonding surface of the device. In some embodiments, the recess variation is between 0.5 nm and 5 nm within the bonding surface of the device. In some embodiments, the conductive layer includes a plurality of conductive contact pads, the plurality of conductive contact pads each having a recess depth by which they are recessed below the bonding surface. In some embodiments, the bonding layer includes a non-conductive layer in which the conductive layer is at least partially embedded. In some embodiments, the non-conductive layer is polished.

BRIEF DESCRIPTION OF THE DRAWINGS

These and other features, aspects, and advantages of the disclosure are described with reference to drawings of certain embodiments, which are intended to illustrate, but not to limit, the present disclosure. It will be understood that the accompanying drawings, which are incorporated in and constitute a part of this specification, are for the purpose of illustrating concepts disclosed herein and may not be to scale.

FIGS. 1a-1b schematically illustrate a direct bonding process according to some embodiments.

FIG. 3 is a diagram showing an example process for protecting a surface of a semiconductor element during processing according to some embodiments.

FIG. 4 is a diagram showing an example process for protecting a surface of a semiconductor element during processing according to some embodiments.

DETAILED DESCRIPTION

Figure 2:
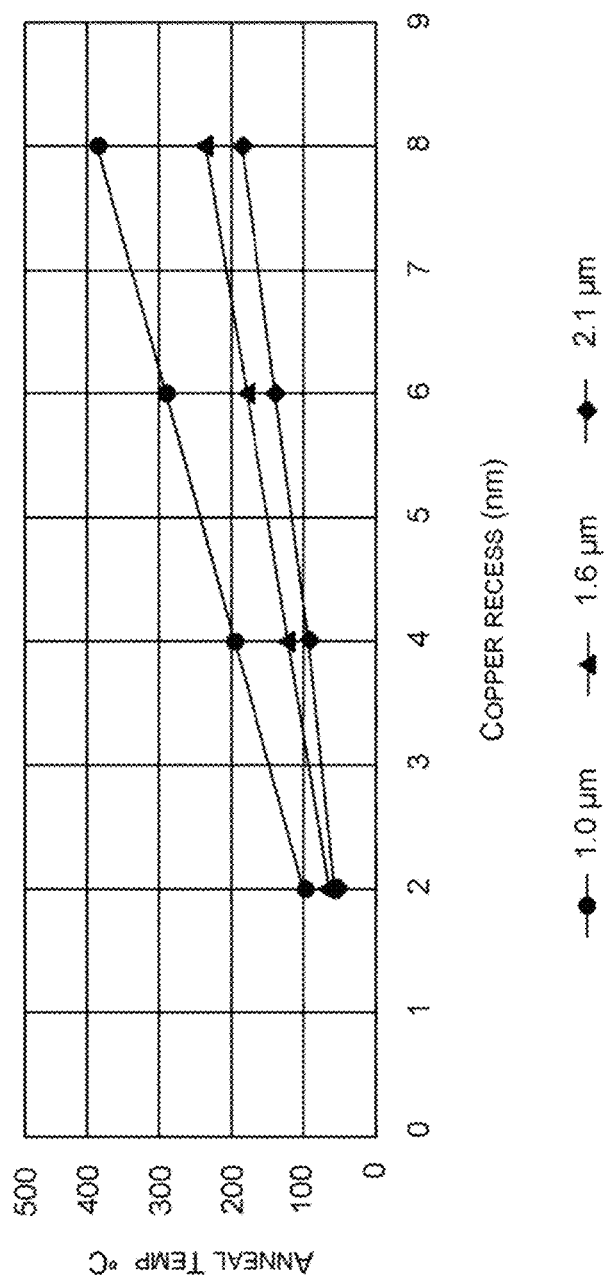
FIG. 2 is a diagram plotting maximum recess distances from a bonding plane versus temperature, for different thicknesses of a thermally expanding metal contact.

Various embodiments disclosed herein relate to directly bonded structures in which two elements can be directly bonded to one another without an intervening adhesive. FIGS. 1a and 1b schematically illustrate a process for forming a directly bonded structure without intervening adhesive according to some embodiments. In FIGS. 1a and 1b, a directly bonded structure 100 comprises two elements 102 and 104 that can be directly bonded to one another without an intervening adhesive. Two or more semiconductor elements (such as integrated device dies, wafers, etc.) 102 and 104 may be stacked on or bonded to one another to form a bonded structure 100. Conductive contact pads 106a of a first element 102 may be electrically connected to corresponding conductive contact pads 106b of a second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive or dielectric material can serve as a first bonding layer 108a of the first element 102 which can be directly bonded to a corresponding non-conductive or dielectric field region serving as a second bonding layer 108b of the second element 104 without an adhesive. The non-conductive bonding layers 108a and 108b can be disposed on respective front sides 114a and 114b of device portions 110a and 110b, such as a semiconductor (e.g., silicon) portion of the elements 2, 3. Active devices and/or circuitry can be patterned and/or otherwise disposed in or on the device portions 110a and 110b. Active devices and/or circuitry can be disposed at or near the front sides 114a and 114b of the device portions 110a and 110b, and/or at or near opposite backsides 116a and 116b of the device portions 110a and 110b. The non-conductive material can be referred to as a non-conductive bonding region or bonding layer 108a of the first element 102. In some embodiments, the non-conductive bonding layer 108a of the first element 102 can be directly bonded to the corresponding non-conductive bonding layer 108b of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108a and/or 108b can comprise a non-conductive material such as a dielectric material, such as silicon oxide, or an undoped semiconductor material, such as undoped silicon.

In various embodiments, direct hybrid bonds can be formed without an intervening adhesive. For example, dielectric bonding surfaces 112a and 112b can be polished to a high degree of smoothness. The bonding surfaces 112a and 112b can be cleaned and exposed to a plasma and/or etchants to activate the surfaces 112a and 112b. In some embodiments, the surfaces 112a and 112b can be terminated with a species after activation or during activation (e.g., during the plasma and/or etch processes). Without being limited by theory, in some embodiments, the activation process can be performed to break chemical bonds at the bonding surface 112a and 112b, and the termination process can provide additional chemical species at the bonding surface 112a and 112b that improves the bonding energy during direct bonding. In some embodiments, the activation and termination are provided in the same step, e.g., a plasma to activate and terminate the surfaces 112a and 112b. In other embodiments, the bonding surface 112a and 112b can be terminated in a separate treatment to provide the additional species for direct bonding. In various embodiments, the terminating species can comprise nitrogen. Further, in some embodiments, the bonding surfaces 112a and 112b can be exposed to fluorine. For example, there may be one or multiple fluorine peaks near layer and/or bonding interface 118. Thus, in the directly bonded structure 100, the bonding interface 118 between two non-conductive materials (e.g., the bonding layers 108a and 108b) can comprise a very smooth interface with higher nitrogen content and/or fluorine peaks at the bonding interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads 106a of the first element 102 can also be directly bonded to corresponding conductive contact pads 106b of the second element 104. For example, a hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., contact pad 106a to contact pad 106b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces 112a, 112b can be prepared and directly bonded to one another without an intervening adhesive as explained above. Conductive contact pads 106a and 106b (which may be surrounded by non-conductive dielectric field regions within the bonding layers 108a, 108b) may also directly bond to one another without an intervening adhesive. In some embodiments, the respective contact pads 106a and 106b can be recessed below exterior (e.g., upper) surfaces 112a and 112b of the dielectric field or non-conductive bonding layers 108a and 108b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108a and 108b can be directly bonded to one another without an adhesive at room temperature in some embodiments and, subsequently, the bonded structure 100 can be annealed. Upon annealing, the contact pads 106a and 106b can expand and contact one another to form a metal-to-metal direct bond. Beneficially, the use of Direct Bond Interconnect, or DBI®, techniques commercially available from Xperi of San Jose, CA, can enable high density of pads 106a and 106b to be connected across the direct bond interface 118 (e.g., small or fine pitches for regular arrays). In some embodiments, the pitch of the bonding pads 106a and 106b, or conductive traces embedded in the bonding surface of one of the bonded elements, may be less than 40 microns or less than 10 microns or even less than 2 microns. For some applications, the ratio of the pitch of the bonding pads 106a and 106b to one of the dimensions (e.g., a diameter) of the bonding pad is less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the contact pads 106a and 106b and/or traces can comprise copper, although other metals may be suitable.

Thus, in direct bonding processes, a first element 102 can be directly bonded to a second element 104 without an intervening adhesive. In some arrangements, the first element 102 can comprise a singulated element, such as a singulated integrated device die. In other arrangements, as shown in FIGS. 1a-1b, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die, as shown in FIGS. 1a-1a. In other arrangements, the second element 104 can comprise a carrier or substrate (e.g., a wafer). The embodiments disclosed herein can accordingly apply to wafer-to-wafer, die-to-die, or die-to-wafer bonding processes.

As explained herein, the first and second elements 102 and 104 can be directly bonded to one another without an adhesive, which is different from a deposition process. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112a and 112b (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108a and 108b can also comprise polished surfaces that are planarized to a high degree of smoothness.

In various embodiments, the metal-to-metal bonds between the contact pads 106a and 106b can be joined such that copper grains grow into each other across the bond interface 118. In some embodiments, the copper can have grains oriented along the 111 crystal plane for improved copper diffusion across the bond interface 118. The bond interface 118 can extend substantially entirely to at least a portion of the bonded contact pads 106a and 106b, such that there is substantially no gap between the non-conductive bonding layers 108a and 108b at or near the bonded contact pads 106a and 106b. In some embodiments, a barrier layer may be provided under the contact pads 106a and 106b (e.g., which may include copper). In other embodiments, however, there may be no barrier layer under the contact pads 106a and 106b, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 106a and 106b, and/or small pad sizes. For example, in various embodiments, the pitch p (i.e., the distance from edge-to-edge or center-to-center, as shown in FIG. 1a) between adjacent pads 106a (or 106b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

In various embodiments, the second element 104 can comprise a singulated device die, and the first element 102 can comprise a wafer. In other embodiments, both elements 102 and 104 can comprise a singulated device die. In such an embodiment, the second element 104 may be initially provided in wafer form or larger substrate and singulated to form the singulated first element 104. However, the singulation process and/or other processing steps may produce debris that can contaminate the planar bonding surface, which can leave voids and/or defects when two elements are bonded. Accordingly, prior to singulation, a protective layer can be provided over the bonding surface before activation and direct bonding in order to prevent debris from contaminating the bonding surface. The protective layer can comprise an organic or inorganic layer (e.g., a photoresist) that is deposited onto the bonding surface (for example, by spin coating, atomic layer deposition, vapor coating, and so forth). Additional details of the protective layer may be found throughout U.S. Pat. No. 10,714,449, the entire contents of which are incorporated by reference herein in their entirety and for all purposes. The wafer containing the first element can be singulated using any suitable method. The protective layer over the bonding surface can beneficially protect the bonding surface from debris. Before direct bonding, the protective layer can be removed from the bonding surface with a cleaning agent, for example with a suitable solvent, such as an alkaline solution or other suitable cleaning agent as recommended by the supplier of the protective layer. The protective layer cleaning agent can be selected such that it does not substantially roughen the smooth bonding surface of the bonding layer and does not substantially etch or contaminate the metal of the contact pad to increase the recess of the pad metal after subsequent cleaning operations. An excessive pad recess may form a recess that is too deep, which may prevent (or reduce the strength of) pad-to-pad bonding at the appropriate annealing conditions (e.g., annealing temperature and times). The cleaning agent can be applied by a fan spray of the liquid cleaning agent or other known methods. For example, the cleaned bonding surface can be ashed (e.g., using an oxygen plasma) and cleaned with deionized water (DIW). In some embodiments, the cleaned element can be activated before direct bonding.

It can be important to protect the metallic contact pads so that the pads are not excessively recessed below the non-conductive bonding region. Excessive pad recesses may be problematic for hybrid bonding device fabrication. For example, the increased pad recesses can form a large gap between opposing pads, such that the annealing temperature is raised in order to form electrical contact between the pads. The larger the recess, the higher the bonding temperature used for the opposing conductive features to contact and form an electrical connection. Various embodiments disclosed herein can form a reliable metal-to-metal direct bond interface below about 200° C., preferably below about 180° C., and even more preferably below about 150° C. In various embodiments, a prebond metal recess can be less than 10 nm, for example, in a range of 1 to 5 nm/µm for metallic structures less than about 4 µm in width. For a through-silicon via (TSV), the prebond metal recess can be between 15 and 4100 nm, for example in a range of about 0.2 to 4 nm/µm depth, depending on the depth of the TSV and the bonding temperature. Typically, chemical mechanical polishing can result in pads with recesses of about 0.5 nm to about 100 nm. In some embodiments, after a CMP step, the pads 106a or 106b may be protruded. The height of the protruded pads 106a or 106b with respect to the bonding surface 112a or 112b may be in a range from about 0.5 nm to about 20 nm, depending on the process specifications.

Accordingly, various embodiments disclosed herein can beneficially reduce the recess depths structures that are to be hybrid direct bonded. Moreover, various embodiments can reduce within-wafer and wafer-to-wafer variability of recesses. Providing reduced and/or consistent recesses can enable the formation of very reliable metal-to-metal direct bonds at comparatively lower anneal temperatures (e.g., less than 275° C., preferably less than 200° C., more preferably below about 180° C., even more preferably below about 150° C.) for micron scale and submicron features. The thermal budget and/or cost of fabrication can also be reduced for the fabrication of direct hybrid bonded devices.

FIG. 2 illustrates a chart showing anneal temperatures for copper pad recesses for pads with different thicknesses. As shown, increasing recess depth utilizes higher anneal temperatures, which increases the thermal budget for the direct bonding process. Further, degradation of the copper pads can increase the recess and, accordingly, increase the anneal temperature for the opposing copper pads to partially or fully contact each other to form a metallurgical bond. A metallurgical bond may be formed, for example, according to the methods, structures, and apparatuses disclosed in U.S. Pat. No. 11,011,494, which is incorporated by reference herein in its entirety and for all purposes.

Various embodiments disclosed herein can utilize a thin protective layer over the bonding surface to protect the bonding surface and the semiconductor element, for example, during a singulation or dicing process. FIG. 3 shows a typical process that uses a thick protective coating or layer (e.g., greater than 3 microns thick). At block 320, a protective coating 312 is applied over a bonding surface 310 of a semiconductor element 302 having a non-conductive region 306 and conductive contact regions 308 which on top of a semiconductor region 314 (e.g., a device portion) and affixed on a dicing tape 304. The semiconductor region 314 can comprise a device portion having active circuitry patterned therein. The protective coating 312 may be applied by spin coating for example. In some embodiments, the protective coating 312 may comprise, for example, a polymer such as a photoresist. In some embodiments, the material used for the protective coating 312 may include a solvent. To remove the solvent in the protective coating 312, the semiconductor element 302 is typically baked at 135° C. for about 180 s to harden the protective coating 312 (e.g., photoresist) and ensure good adhesion between the protective coating 312 and the semiconductor element 302 beneath. The protective coating 312 can be deposited over the semiconductor element 302, and at block 322, the semiconductor element 302 can be singulated to form singulated elements 302a-302d having non-conductive regions 306a-306d and conductive contact regions 308a-308d. At block 324, the protective coating 312 can be removed.

The process depicted in FIG. 3 can work well for interconnect processes that use ball grid arrays, controlled collapse chip connection (C4), and so forth, which use surfaces with relatively large topographic features (for example, a typical C4 process may use solder spheres that are several microns to tens of microns in diameter). However, when used in direct bonding processes, the cleaning fluid used to remove the protective layer 312 may unacceptably increase a recess 309 of the copper pads used in direct bonding. For example, the relatively thick coating can have longer coating removal times (for example, from about 300 seconds to about 1200 seconds) and longer exposure to the cleaning medium which can lead to a higher degree of recess 309. Non-uniform removal of the protective coating 312 across the substrate can also cause an increase in the recess non-uniformity across the semiconductor element 302. There can also be a center to edge variation in the cleaned substrate, as well as greater wafer to wafer variation. In some processes, for example direct bonding, it is important that the recess of all the pads in a die be substantially uniform. For example, various embodiments disclosed herein (e.g., embodiments of FIGS. 4-7) can beneficially ensure that the recess variation among the pads of the die is less than 25%, less than 10%, less than 5%, less than 2%, or less than 1%, or less than about 0.5%. In various embodiments, the recess variation among the pads of the due can be in a range of 0.1% to 10%, in a range of 0.1% to 5%, or in a range of 0.5% to 5%. The recess variation can be less than 5 nm, less than 3 nm, less than 2 nm, or less than 1 nm, for example in a range of 0.5 nm to 5 nm in some embodiments. In some arrangements, the recess variation can comprise a maximum difference between recess depths among the plurality of conductive contact features. In some arrangements, the recess variation can comprise an average difference between recess depths among the plurality of conductive contact features. Residue management may also be challenging, as the thick protective coating 312 may result in a relatively large amount of residue, which may be difficult to fully remove from the semiconductor elements 302a-302d. Additionally, higher baking temperatures may make it more difficult to strip the protective layer 312 from the semiconductor elements 302a-302d. Additionally, at higher temperatures the protective layer 312 may react with metallic pads 308a-308d, and such a reaction may tend to roughen the metallic bonding pads 308a-308d and increase the recess of the metallic bonding pads 308a-308d.

In some embodiments, for the traditional thick resist and high baking temperature approach, the recess of pads 308a-308d may range from about 60 nm to about 200 nm or more for a 2 micrometer thick metal pad, for example. After the solvent cleaning step to remove the protective layer 312, some of the pads 308a-308d disposed at various portions of the bonding surface 310 may be clean, for example, after 180 s, while pads at other portions of the bonding surface 310 may still be contaminated with the hard baked protective layer 312. Additional cleaning times of, for example, 180 s or longer, may be used to strip the protective layer from the surface of pads 308a-308d or the bonding surface 310. Thus, some clean pads may be exposed to solvent action for a significant additional time. Depending on the dissolution or loss of pad material during the protective layer 312 removal, large variations in recess may be formed within a given die and/or between dies located at different portions of the substrate 314, for example dies located at the center and those disposed close the edge of the substrate 314. The recess variation (i.e., the maximum difference between recess depths from the bonding surface 310 for any two pads) in pads within any given die may vary by an amount greater than 10 nm, e.g., 15 nm or greater. These large variations in recess 309 within a given die and across the substrate 314 can be problematic, because a higher bonding temperature may be needed to form adequate metal-to-metal bonds in the bonded substrates 100 of FIG. 1b for pads with deeper recesses, as shown in FIG. 2.

Accordingly, in various embodiments, as shown in FIG. 4 in block 420, a thinner protective coating 412 can instead be applied over the bonding surface 310 of the semiconductor element 302, for example by spin coating, atomic layer deposition, or vapor coating. The thin protective coating can have a thickness of less than 3 microns, less than 2 microns, less than 0.25 microns, or less than 0.1 microns. For example, in various embodiments, the thickness of the protective coating can be in a range of 0.05 microns to 2 microns, or in a range of 0.1 microns to 0.25 microns. The thin protective coating can comprise, for example, an organic layer in some embodiments. The thin protective layer may be baked at a temperature lower than 130° C. and preferably at a temperature lower than 110° C. and even lower than 70° C. For example, the protective layer can comprise a hydrophobic coating and/or a hydrophilic coating or combination of both. In some embodiments, the protective layer can comprise a photoresist. In the embodiment of FIG. 4, the protective layer can be blanket deposited across the semiconductor element, including over contact pads 308 and over non-conductive bonding region(s) 306. Advantageously, the thinner protective layer can have less variance in coating thickness compared to a thicker layer.

In various embodiments, the bonding surface can be prepared for direct bonding prior to providing the protective layer 312. For example, the bonding surface can be planarized before providing the protective layer 312. In some embodiments, the bonding surface can be activated before providing the protective layer 312. Activating the first bonding surface can comprise plasma activating the first bonding surface. Plasma activating the first bonding surface can comprise exposing the first bonding surface to a nitrogen-containing plasma. In other embodiments, the bonding surface of the semiconductor element 302 to be singulated may be briefly exposed to oxygen plasma (ashing), to form a very thin oxide (for example, a few nanometers thick) on the surface of the pads 308, before applying the protective layer 312.

The semiconductor element 302 can remain covered with the protective layer 312 for any suitable time period. For example, in some embodiments, the semiconductor element 302 can be prepared for direct bonding and coated with the protective layer 312, and subsequently stored and/or transported to a different location or facility. In some cases, the protected semiconductor element 302 can remain protected by the protective layer 312 for a period greater than 24 hours, or for a period of a week or longer, or a month or longer. As shown in block 422, prior to removal of the protective layer 312, the semiconductor element may be singulated into a plurality of semiconductor elements having bonding surfaces 310a-310d, non-conductive regions 306a-306d and conductive contact regions 308a-308d. At block 424, the protective layer 312 can be removed in any suitable manner before direct bonding. For example, the protective layer 312 can be removed with any suitable cleaning process. In some embodiments, a first cleaning process can utilize a highly alkaline solution, for example dilute tetramethylammonium hydroxide, or other suitable solvents recommended by the supplier of the protective layer (such as blends of polyglycols, or a modified ketone, for example) to strip the protective coating 412. The modified ketone can have minimal interaction with a dicing tape (unlike acetone, which may readily attack the dicing tape) and/or the metal of the contact pads 306a and 306b. In one embodiment, when the protective layer is a photoresist material, the coated photoresist protective layer may be exposed to UV light to degrade the resist layer, thus reducing the cleaning times to strip the protective layer from the bonding surface of the semiconductor element. Advantageously, the protective layer 312 may be removed more quickly (e.g., in about 60 s or less) than a thick protective layer as depicted in FIG. 3. Overstripping times can also be significantly shorter, for example less than 30 seconds, less than 20 seconds, or less than 15 seconds, whereas overstripping times for thicker layers can often exceed 1 minute, 2 minutes, or more. Additionally, less debris may remain.

In some embodiments, a second cleaning process can additionally or alternatively be used. For example, the second cleaning process can be used for cleaning dicing particles and other debris from dies and dicing sheet. In this example, the first cleaning step may strip the protective layer 312 from the bonding surface of the semiconductor element and the second cleaning step may comprise a cleaning solution tailored to remove unwanted organic materials and unwanted particulates from the plurality of semiconductor elements and the dicing lanes of the dicing tape. In this embodiment, the first cleaning step may comprise a dry process, for example applying oxygen plasma to strip the very thin organic protective layer from the surface of the singulated semiconductor elements. In some embodiments, the second cleaning step may comprise a wet cleaning solution. In such cleaning steps, a suitable solvent containing a suitable surfactant or particulate removing agent may be used to clean the ashed surface of the semiconductor element. The cleaning step is typically followed by a deionized (DI) water rinse and drying step.

Beneficially, the thin protective coating can utilize a cleaning fluid, as explained above, that is more amenable to the materials used in the semiconductor element. The shorter duration of the removal process and overall cleaning times can beneficially reduce the degree to which the copper pads are degraded by the cleaning process, as compared to processes using a thicker protection layer and longer cleaning processes. The embodiment of FIG. 4 can accordingly provide shallower recesses 309 and more consistent recess depths (i.e., less recess variation), which can improve direct bond reliability in hybrid bonded structures. In some embodiments, no two pads may have a difference in recess depths of greater than 5 nm, greater than 3 nm, greater than 1 nm, or greater than 0.5 nm. The recess variation among the pads of the die is less than 25%, less than 10%, less than 5%, less than 2%, or less than 1%, or less than about 0.5%. In various embodiments, the recess variation among the pads of the due can be in a range of 0.1% to 10%, in a range of 0.1% to 5%, or in a range of 0.5% to 5%. The recess variation can be less than 5 nm, less than 3 nm, less than 2 nm, or less than 1 nm, for example in a range of 0.5 nm to 5 nm in some embodiments. In some arrangements, the recess variation can comprise a maximum difference between recess depths among the plurality of conductive contact features. In some arrangements, the recess variation can comprise an average difference between recess depths among the plurality of conductive contact features.

Figure 5:
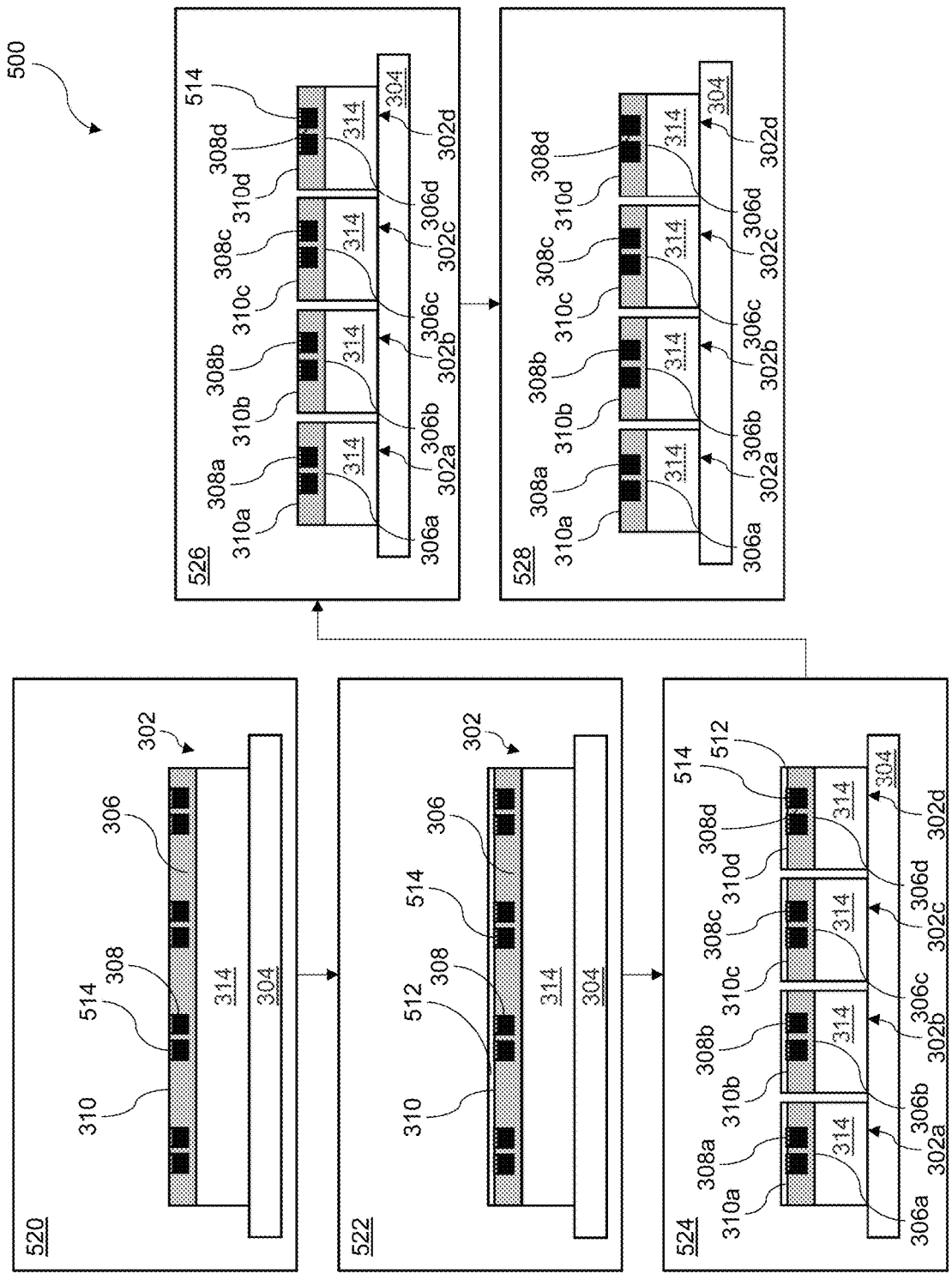
FIG. 5 is a diagram showing an example process for protecting a surface of a semiconductor element during processing according to some embodiments.

FIG. 5 illustrates another example process 500 in which a thin protective layer 512 is provided over a passivation layer 514 according to some embodiments. At step 520, a passivation layer 514 can be selectively provided over the contact pads 308. For example, a wet chemical process and/or a plasma process can be used to selectively oxidize the contact pads 308. In some embodiments, a few monolayers of a metal complexing agent such as benzotriazole or a similar compound may be selectively coated on the contact pads 308 by known methods.

At step 522, a thin protective layer 512 (e.g., a protective layer less than about 2 µm thick, and preferably less than about 0.2 µm thick) can be provided over the pads 308 and the non-conductive bonding region 306 of the element. In the illustrated embodiment, the protective layer 512 is blanket deposited over the element. At step 524, the element 302 can be singulated, and, at step 526, the protective layer 512 can be removed as explained above. In some embodiments, the protective layer may be striped in less than about three minutes At step 528, the passivation layer 514 can be selectively removed from the contact pads 308 by a wet etch, a foaming gas, or other suitable means. Additional cleaning may be performed for particle management.

Figure 6:
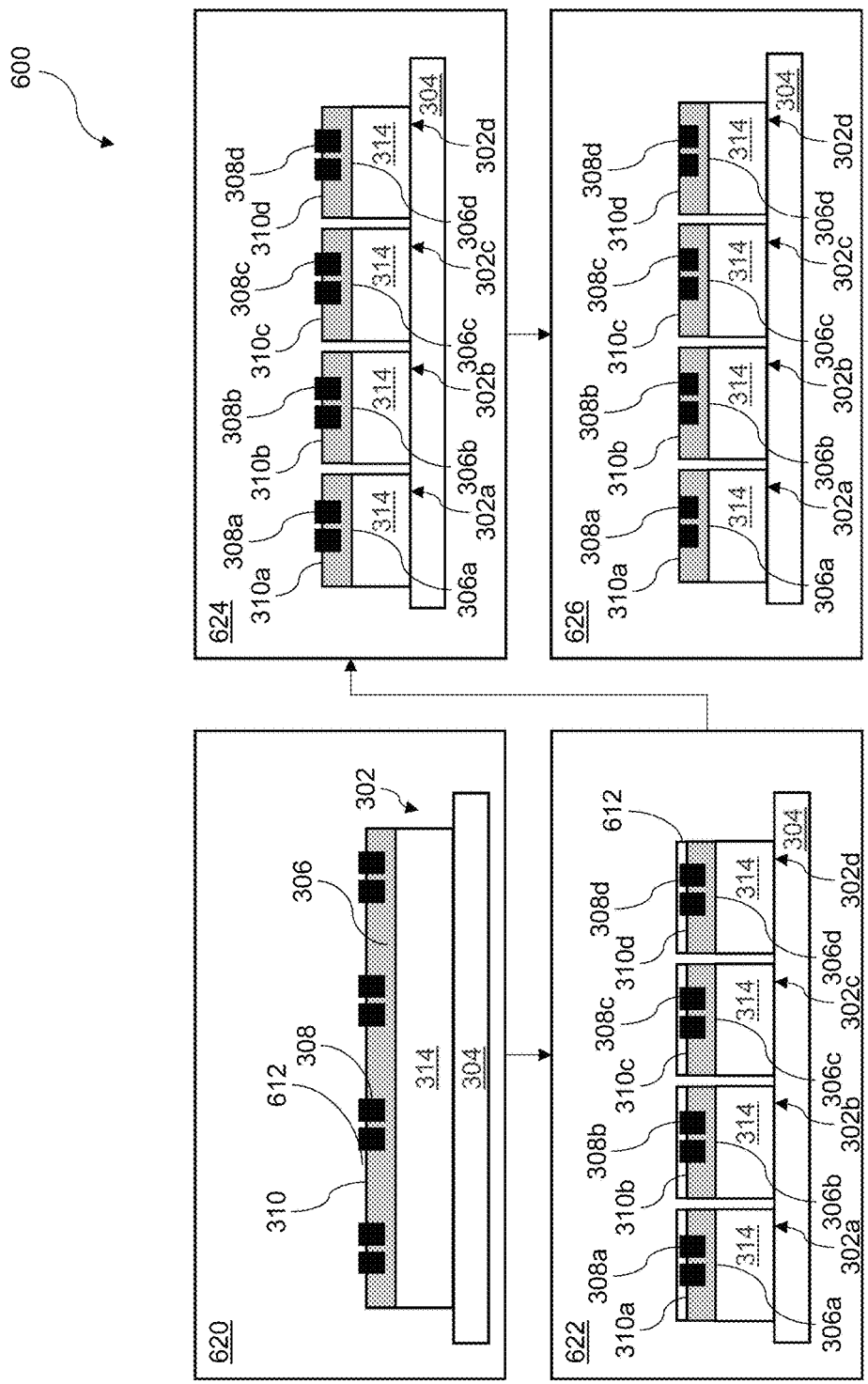
FIG. 6 is a diagram showing an example process for protecting a surface of a semiconductor element during processing according to some embodiments.

FIG. 6 illustrates another example process 600 according to some embodiments, in which the contact pads 308 protrude above the non-conductive bonding material 306 before application of the protective layer 612. As shown in block 620, the contact pads 308 may protrude above the bonding surface 310 of the non-conductive bonding material 306 (for example, if the non-conductive bonding material 306 has been etched previously or as the result of a chemical-mechanical-polished or CMP process). At block 622, a protective layer 612 (which may be the same as the protective layer 412) can be provided over the protruding contact pads 308 and the non-conductive bonding material 306, and the element 302 can be singulated. At block 624, the protective layer 612 can be removed. In some embodiments, at block 624, removing the protective layer 612 also causes some removal of the surface of the contact pads 308, reducing the protrusion of the contact pads 308 above the surface of the non-conductive bonding material 306. At block 626, the bonding surface can be planarized (for example, by a chemical-mechanical-polishing or CMP process) such that the contact pads 308 are recessed relative to the surface of the non-conductive bonding material 306. Pad recess may also be controlled by managing the copper/oxygen interaction. In other embodiments, after stripping the protective layer 612, unwanted protrusion on the pads 308 may be removed by cleaning the bonding surface 310 and pads 308 with a dilute pad cleaning agent to form a known or desired recess in the pads 308. The cleaning may form a known recess without degrading the bonding surface 310 or the bonding surface of the recessed pads. For example, the cleaning agent may not result in significant roughening of the bonding surface 310 or the pads 308 and may not result in the formation of unwanted particulates on the bonding surfaces that could impair direct between opposing substrates without adhesive material.

Figure 7:
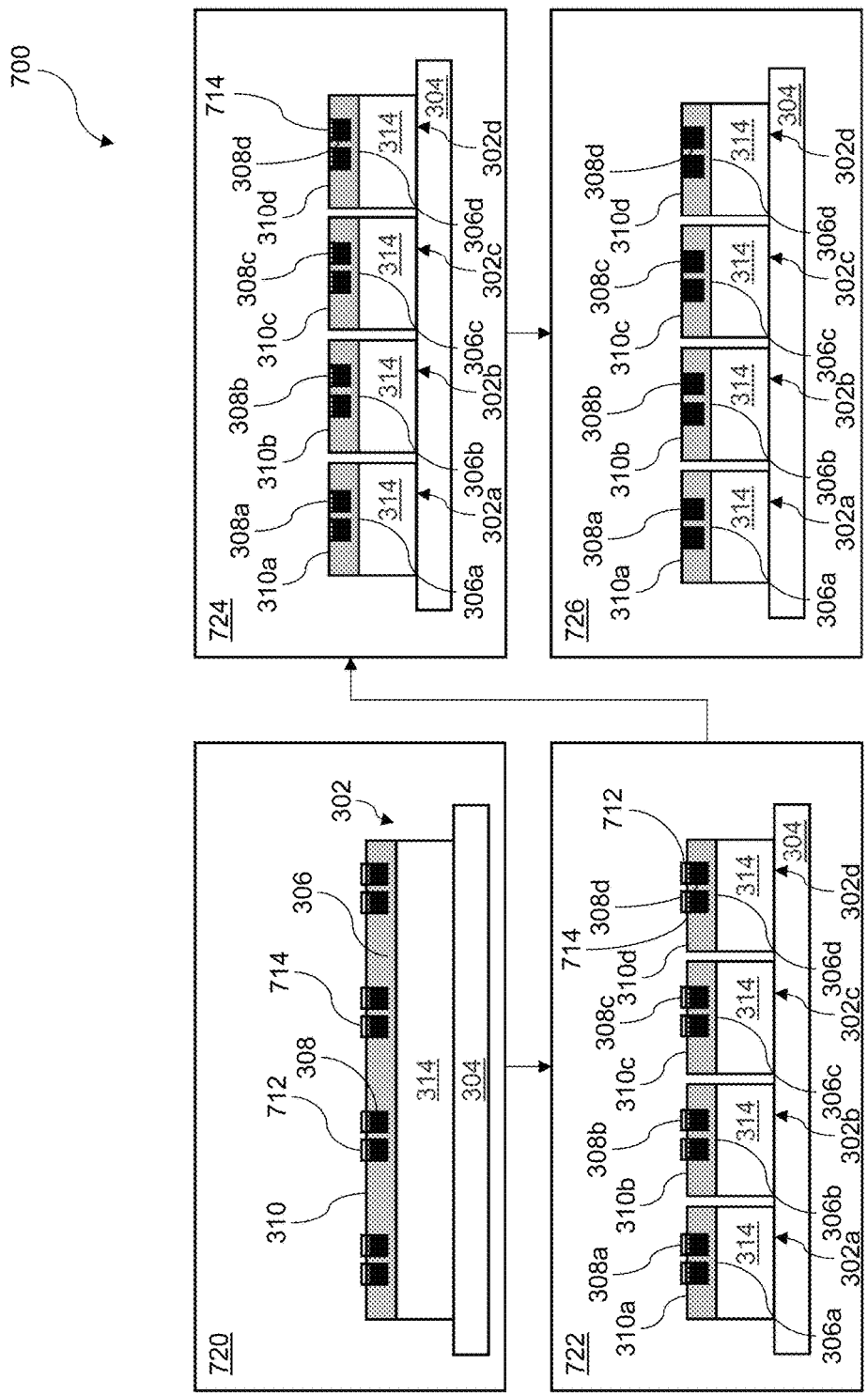
FIG. 7 is a diagram showing an example process for protecting a surface of a semiconductor element during processing according to some embodiments.

FIG. 7 illustrates an example process 700 according to some embodiments, in which a protective coating is selectively provided over the contact pads, as opposed to being deposited as a blanket coating. At block 720, a passivation layer 714 (which may be similar to or the same as passivation layer 514) can be applied on the pads 308, and a protective layer 712 can be applied over the passivation layer 714. In some embodiments, only a passivation layer 714 may be selectively applied to protect the pads without the use of a protective layer 712, which can reduce recess variation and recess increases due to removal of the protective layer 712. Thus, no organic blanket layer may be provided over the entire surface of the semiconductor element. In some embodiments, therefore, the passivation layer 714 can serve as the protective layer to protect the pads during singulation, such that a separate protective layer 712 may not be applied. The passivation layer 714 can be provided to oxidize the pads, which can resist cleaning chemicals better than copper. At block 722, the element 302 can be diced while maintaining a wet surface. After dicing, the element 302 can be cleaned, for example, using water and surfactants. The passivation layer on the pad can be removed using any suitable method. For example, the passivation layer can be removed using a dilute acid or base solution, and/or by an oxidizer/caustic to remove the hydrophobic coated region without substantially attacking the copper pads.

In some embodiments, reactive ion etching (RIE) can be used to remove the thin protective coating.

In some embodiments, a saw can be used to singulate the element. In other embodiments, RIE can be used to singulate the semiconductor element into a plurality of singulated device dies. In such embodiments, the protective layer can be provided to a thickness of approximately 1 micron, e.g., in a range of 1 micron to 3 microns. The RIE process may be used to singulate the element, and the protective layer can protect the pads during RIE. The RIE process, however, may reduce the thickness of the protective layer sufficiently such that a subsequent cleaning process can be used to remove the remaining thin protective layer without causing an excessively large recess. At block 724, the protective layer 712, if present, can be removed and, at block 726, the passivation layer 714 can be removed to expose the surface of the conductive contact regions 308a-d.

In some embodiments, conductive pads 308 having varying dimensions may be formed in dielectric layer 306 and the conductive pads 308 may have exposed bonding surfaces. For example, the various conductive features within a die may comprise pads with a width of 2 to 4 microns, 5 to 8 microns, or 10 to 15 microns. Conductive pads may be arranged in arrays having defined pitches. In some embodiments, the pitch of smaller pads may be smaller than the pitch of larger pads. Advantageously, the methods described herein can result in recesses formed on the various pads with varying width and pitch being the same or similar. For example, the variation in recess induced by protective layer coating, singulation, protective layer stripping, and other surface preparation steps may be less than about 3 nm across a given die, for example, less than 2 nm or less than 1 nm across a die. In some embodiments, the recess variation across a die can be in a range of 0.3 nm to 3 nm, in a range of 0.5 nm to 3 nm, or in a range of 1 nm to 3 nm. With the shallow recess and small variation in recess across the die, a bonded structure (such as the bonded structure 100) can be formed at a comparatively lower temperature compared to dies with deeper recesses and/or large variation in recesses with a given die. With the lower temperature bonding operation, dies having larger differences in thermal expansion may be directly bonded without an adhesive layer. For example, the thermal expansion of semiconductor element 104 may be different from that of semiconductor element 102. As just one example, in some embodiments, the difference between the thermal expansion of the bonded semiconductor elements 102 and 104 may be at least 10%.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonding method comprising:
   preparing a first bonding surface of a first element for direct bonding to a second bonding surface of a second element, wherein preparing the first bonding surface comprises plasma activating the first bonding surface; and
   after the preparing, providing a protective layer over at least a portion of the prepared first bonding surface of the first element, the protective layer having a thickness less than 3 microns.

2. The bonding method of claim 1, wherein the thickness of the protective layer is less than 2 microns.

3. The bonding method of claim 2, wherein the thickness of the protective layer is in a range of 0.05 microns to 2 microns.

4. The bonding method of claim 1, wherein providing the protective layer comprises blanket depositing the protective layer over the first bonding surface.

5. The bonding method of claim 1, further comprising, before providing the protective layer, selectively providing a passivation layer over a plurality of contact pads, and wherein providing the protective layer comprises providing the protective layer over the passivation layer.

6. The bonding method of claim 1 wherein the first bonding surface includes a plurality of contact pads, the contact pads protruding above a first non-conductive region of the first bonding surface, wherein providing the protective layer comprises providing the protective layer over at least the protruding contact pads.

7. The bonding method of claim 6, wherein providing the protective layer comprises blanket depositing the protective layer over the first bonding surface.

8. The bonding method of claim 1, wherein the first bonding surface includes a first plurality of conductive contact pads and a first non-conductive bonding region, the first plurality of conductive contact pads recessed below the first non-conductive bonding region.

9. The bonding method of claim 8, wherein a variation in recess depth of the first plurality of contact pads across the first element is less than 25%.

10. The bonding method of claim 9, wherein the variation in recess depth of the first plurality of contact pads across the first element is less than 10%.

11. The bonding method of claim 1 further comprising removing the protective layer.

12. The bonding method of claim 11, wherein the first element comprises a wafer, the method further comprising, before removing the protective layer, singulating the wafer to form a plurality of singulated elements.

13. The bonding method of claim 1, further comprising, after removing the protective layer, directly bonding the first bonding surface of the first element to the second bonding surface of the second element without an intervening adhesive.

14. The bonding method of claim 13, wherein the first bonding surface comprises a first plurality of conductive contact pads and a first non-conductive bonding region, wherein the second bonding surface comprises a second plurality of conductive contact pads and a second non-conductive bonding region, and wherein directly bonding comprise hybrid direct bonding, including directly bonding the first and second pluralities of conductive contact pads to one another without an adhesive and directly bonding the first and second non-conductive bonding regions to one another without an adhesive.

15. The bonding method of claim 13, further comprising activating the second bonding surface before directly bonding.

16. A bonding method comprising:
preparing a first bonding surface of a first element for direct bonding to a second bonding surface of a second element; and
after the preparing, selectively providing a protective layer over a plurality of contact pads of the first bonding surface without blanket depositing the protective layer over the first bonding surface.

17. The bonding method of claim 16, wherein the protective layer has a thickness less than 3 microns.

18. A bonding method comprising:
preparing a first bonding surface of a first element for direct bonding to a second bonding surface of a second element; and
after the preparing, selectively providing a passivation layer over a plurality of contact pads of the first bonding surface without blanket depositing the passivation layer over the first bonding surface.

19. The bonding method of claim 18, wherein providing the passivation layer comprising oxidizing surfaces of the contact pads.

* * * * *